United States Patent
Abel

(10) Patent No.: US 12,037,517 B2
(45) Date of Patent: Jul. 16, 2024

(54) RUTHENIUM CMP CHEMISTRY BASED ON HALOGENATION

(71) Applicant: Tokyo Electron Limited, Tokyo (JP)

(72) Inventor: Paul Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/381,516

(22) Filed: Oct. 18, 2023

(65) Prior Publication Data

US 2024/0043721 A1 Feb. 8, 2024

Related U.S. Application Data

(62) Division of application No. 17/674,593, filed on Feb. 17, 2022, now Pat. No. 11,820,919.

(Continued)

(51) Int. Cl.
| | |
|---|---|
| *H01L 21/321* | (2006.01) |
| *B24B 1/00* | (2006.01) |
| *B24B 37/04* | (2012.01) |
| *C09G 1/02* | (2006.01) |
| *C09G 1/04* | (2006.01) |

(Continued)

(52) U.S. Cl.
CPC .................. *C09G 1/02* (2013.01); *B24B 1/00* (2013.01); *B24B 37/044* (2013.01); *C09G 1/04* (2013.01); *C09G 1/06* (2013.01); *C09K 3/1454* (2013.01); *C09K 13/00* (2013.01); *C09K 13/02* (2013.01);

(Continued)

(58) Field of Classification Search
None
See application file for complete search history.

(56) References Cited

U.S. PATENT DOCUMENTS

| | | |
|---|---|---|
| 6,290,736 B1 | 9/2001 | Evans et al. |
| 6,797,624 B2 | 9/2004 | Lee |

(Continued)

FOREIGN PATENT DOCUMENTS

| | | |
|---|---|---|
| CN | 103252710 | 8/2013 |
| KR | 10-2012-0066515 | 6/2012 |
| WO | 2021162978 | 8/2021 |

OTHER PUBLICATIONS

Notification of Transmittal of The International Search Report and the Written Opinion of the International Searching Authority, or the Declaration, PCT/US2022/041873, Dec. 21, 2022, 8 pgs.

*Primary Examiner* — Jiong-Ping Lu
(74) *Attorney, Agent, or Firm* — Egan, Enders & Huston LLP.

(57) ABSTRACT

The present disclosure provides a new corrosion control chemistry for use in ruthenium (Ru) chemical-mechanical polishing (CMP) processes. More specifically, the present disclosure provides an improved CMP slurry chemistry and CMP process for planarizing a ruthenium surface. In the CMP process disclosed herein, a ruthenium surface (e.g., a post-etch ruthenium surface) is exposed to a CMP slurry containing a halogenation reagent, which reacts with the ruthenium surface to create a halogenated ruthenium surface, and a ligand for ligand-assisted reactive dissolution of the halogenated ruthenium surface. Relative amounts of the halogenation agent and the ligand can be controlled in the CMP slurry, so as to provide a diffusion-limited etch process that improves pos-etch surface morphology, while providing high material removal rates.

20 Claims, 2 Drawing Sheets

Related U.S. Application Data

(60) Provisional application No. 63/257,214, filed on Oct. 19, 2021.

(51) Int. Cl.
  *C09G 1/06* (2006.01)
  *C09K 3/14* (2006.01)
  *C09K 13/00* (2006.01)
  *C09K 13/02* (2006.01)
  *C09K 13/06* (2006.01)
  *H01L 21/306* (2006.01)

(52) U.S. Cl.
  CPC ........ *C09K 13/06* (2013.01); *H01L 21/30625* (2013.01); *H01L 21/3212* (2013.01)

(56) References Cited

U.S. PATENT DOCUMENTS

| | | |
|---|---|---|
| 8,008,202 B2 | 8/2011 | White et al. |
| 8,591,763 B2 | 11/2013 | Li |
| 8,906,123 B2 | 12/2014 | Shi |
| 2002/0197855 A1 | 12/2002 | Kim et al. |
| 2006/0037942 A1 | 2/2006 | Yun et al. |
| 2006/0076317 A1* | 4/2006 | De Rege Thesauro ............... H01L 21/3212 438/692 |
| 2014/0017893 A1 | 1/2014 | Minami et al. |
| 2016/0107286 A1 | 4/2016 | Sakashita et al. |
| 2020/0105580 A1 | 4/2020 | Lee et al. |
| 2020/0181454 A1 | 6/2020 | Ko et al. |
| 2022/0010206 A1 | 1/2022 | Shimoda et al. |
| 2023/0118455 A1 | 4/2023 | Abel |

\* cited by examiner

RUTHENIUM CMP CHEMISTRY BASED ON HALOGENATION

This application is a divisional of U.S. patent application Ser. No. 17/674,593, filed Feb. 17, 2022 (now U.S. Pat. No. 11,820,919 issued on Nov. 21, 2023), which claims priority to U.S. Provisional Patent Application Ser. No. 63/257,214, filed Oct. 19, 2021, entitled "RUTHENIUM CMP CHEMISTRY BASED ON HALOGENATION"; the disclosure of which is expressly incorporated herein by reference. This application is related to U.S. patent application Ser. No. 17/674,579, filed Feb. 17, 2022, entitled "METHODS FOR WET ATOMIC LAYER ETCHING OF RUTHENIUM," which is commonly owned, filed on the same day therewith and expressly incorporated herein by reference.

BACKGROUND

This disclosure relates to semiconductor device manufacturing, and, in particular, to the removal and etching of polycrystalline materials, such as metals. During routine semiconductor fabrication, various metals formed on a substrate may be removed by patterned etching, chemical-mechanical polishing (CMP), as well as other techniques. A variety of techniques are known for etching layers on a substrate, including plasma-based or vapor phase etching (otherwise referred to as dry etching) and liquid based etching (otherwise referred to as wet etching).

Chemical-mechanical polishing (CMP) has become an indispensable tool for planarization in semiconductor manufacturing. CMP uses a slurry containing a solvent, an abrasive grit, and reactive chemicals designed to corrode the surface being polished. The combination of surface reaction and action of the abrasive grit leads to enhanced material removal at elevated points on the surface, thus planarizing the surface.

One challenge with chemical-mechanical polishing is surface corrosion. Surface corrosion must be well controlled to prevent pitting, buildup of corrosion products on the surface of the substrate, and surface damage from mechanical removal of insoluble products. Surface corrosion control, however, must not come at the expense of throughput. That is, the corrosion rate must be high enough to support material removal rates compatible with high volume manufacturing.

Ruthenium (Ru) is a noble metal currently being considered as a replacement for copper in back end of line (BEOL) metallization, as well as front end of line (FEOL) features such as buried power rails (power rails positioned below active devices). Ruthenium's nobility, however, makes Ru difficult to etch and planarize.

For example, U.S. patent application Ser. No. 17/580,936, filed Jan. 21, 2022, entitled "Dynamically Adjusted Purge Timing in Wet Atomic Layer Etching" describes a wet ALE process for etching various transition metals, including ruthenium. In the co-pending application, a modified surface layer is formed by exposing surfaces of the Ru metal to an oxidizing agent, which forms a metal-oxide on the exposed surfaces. Although a ruthenium dioxide ($RuO_2$) surface layer is easy to form using a chemical solution containing dissolved oxygen or another oxidizing agent, the stability and insolubility of this surface oxide makes it difficult to deal with in the etch process. As such, strong oxidizers are typically used in conventional etch processes to create soluble or volatile ruthenium-oxide compounds.

Some commercially available ruthenium etchants contain strong oxidizers, such as sodium hypochlorite, ceric ammonium nitrate and periodic acid, which oxidize the ruthenium surface to create ruthenium tetroxide ($RuO_4$). Of these chemicals, the most effective etchants, ceric ammonium nitrate and sodium hypochlorite, are problematic because they pose a metal contamination hazard in the subsequently formed device. For example, incorporation of trace amounts of sodium or cerium in the front end of line can significantly degrade transistor performance. Periodic acid, on the other hand, is expensive and cannot be used to provide a cost-effective etch process for ruthenium.

Another problem with conventional etch processes used for etching ruthenium is that they tend to produce a rough post-etch surface. This is because ruthenium grain boundaries tend to be much more reactive compared to the grain surface, which leads to preferential etching at the grain boundaries compared to the grain surfaces. As such, chemical mechanical polishing is often used in conventional processes to smooth the post-etch ruthenium surface.

Like ruthenium etch chemistries, conventional ruthenium CMP slurries generally rely on strong oxidizers to corrode the ruthenium surface. As with etching, these oxidizers tend to react preferentially at the grain boundaries, which leads to pitting of the Ru surface during CMP. Although less aggressive oxidizers may be used to reduce pitting, the use of such oxidizers in the CMP slurry leads to much lower material removal rates. The material removal rate decreases substantially because the corrosion products are no longer soluble, so mechanical polishing becomes the only process for material removal.

A need, therefore, exists for a new ruthenium CMP slurry chemistry, which improves smoothing of the post-etch surface, while providing high material removal rates.

SUMMARY

The present disclosure provides a new corrosion control chemistry for use in ruthenium (Ru) CMP processes. More specifically, the present disclosure provides a new ruthenium CMP slurry chemistry that uses halogenation of the ruthenium surface to form ruthenium halide or ruthenium oxyhalide surface intermediates, and reactive dissolution to chemically remove the ruthenium halide or ruthenium oxyhalide surface intermediates. Halogenation of the ruthenium surface can be accomplished using radical halogenation of chemical halogenating agents. On its own, halogenation is self-limiting, and the kinetics of reactive dissolution are temperature dependent. The self-limiting nature of halogenation limits pitting of the ruthenium surface. The temperature dependent kinetics of dissolution further aid in planarization of the ruthenium surface as the mechanical polishing process raises the local temperature around high points on the surface.

According to one embodiment, an improved chemical-mechanical polishing (CMP) process is provided herein for planarizing a ruthenium surface. In the CMP process disclosed herein, a ruthenium surface (e.g., a post-etch ruthenium surface) may be exposed to a CMP slurry containing a halogenation reagent, which reacts with the ruthenium surface to create a ruthenium halide or oxyhalide surface, and a ligand for ligand-assisted reactive dissolution of the ruthenium halide or oxyhalide surface. Relative amounts of the halogenation agent and the ligand can be controlled in the CMP slurry, so as to provide a diffusion-limited etch process that improves post-etch surface morphology, while providing high material removal rates.

A wide variety of halogenation reagents (such as, e.g., trichloroisocyanuric acid (TCCA)) in a non-aqueous solvent (such as, e.g., ethyl acetate (EA)) can be used for this process. Since the ruthenium halide or oxyhalide surface is insoluble in non-aqueous solvent, ligand-assisted reactive dissolution is used to facilitate chemical removal of the ruthenium halide or oxyhalide surface. A wide variety of ligands (such as, e.g., acetyl acetone (ACAC) or aminopolycarboxylic acids) can be used for reactive dissolution of the ruthenium halide or oxyhalide surface.

According to another embodiment, a composition is provided herein comprising a new CMP slurry. The new CMP slurry may generally include a solvent, a halogenation agent that halogenates a ruthenium surface to form a halogenated ruthenium surface, a ligand that reacts with the halogenated ruthenium surface to dissolve the halogenated ruthenium surface, and a catalyst that increases the rate of a ligand exchange reaction with the halogenated ruthenium surface. In some embodiments, relative amounts of the halogenation agent and the ligand in the CMP slurry may be selected to provide a rate of halogenation of the ruthenium surface that is greater than a rate of dissolution of the halogenated ruthenium surface.

In some embodiments, the CMP slurry described herein includes a halogenating agent, but does not include an oxide-forming oxidizing agent. As used herein, an oxide-forming oxidizing agent is an oxidizing agent that reacts with the ruthenium surface to form ruthenium-oxide layer on the ruthenium surface. Although a halogenating agent may halogenate and chemically oxidize the ruthenium surface, it does not react with the ruthenium surface to form a ruthenium-oxide layer on the ruthenium surface.

In other embodiments, the CMP slurry described herein may include a halogenating agent and an oxide-forming oxidizing agent. For example, the CMP slurry may further contain a predetermined amount of water or dissolved oxygen. When halogenation is performed in the presence of an oxide-forming oxidizing agent, such as water or dissolved oxygen, a halogenated ruthenium surface containing a ruthenium-oxide-halogen species is created on the ruthenium surface. Since the ruthenium-oxide-halogen species is generally more soluble than the halogenated ruthenium surface layer, the presence of ruthenium-oxide-halogen species increases the material removal rate in the CMP process.

In some embodiments, the halogenation agent included within the CMP slurry may be a chlorination agent. In such embodiments, the chlorination agent may react with the ruthenium surface to form a chlorinated ruthenium surface, and the ligand may be reactive with the chlorinated ruthenium surface.

In some embodiments, the halogenation agent may include a chlorination agent dissolved in a solvent. For example, the chlorination agent may be trichloroisocyanuric acid (TCCA), oxalyl chloride, thionyl chloride or N-chlorosuccinimide, and the solvent may be ethyl acetate, acetone, acetonitrile, or a chlorocarbon. In such embodiments, the halogenation agent may react with the ruthenium surface to form a self-limiting $RuCl_3$ passivation layer.

It is noted that the halogenation agent disclosed herein is not strictly limited to chlorination agents. In some embodiments, for example, the halogenation agent may be a fluorinating agent. In such embodiments, the fluorinating agent may react with the ruthenium surface to form a fluorinated ruthenium surface, and the ligand may be reactive with the fluorinated ruthenium surface. In other embodiments, the halogenation agent may be a brominating agent. In such embodiments, the brominating agent may react with the ruthenium surface to form a brominated ruthenium surface, and the ligand may be reactive with the brominated ruthenium surface.

In some embodiments, the ligand included within the CMP slurry may include ethylenediaminetetraacetic acid (EDTA), acetylacetone (ACAC), iminodiacetic acid (IDA) or diethylenetriaminepentaacetic acid (DTPA), and the catalyst may be a base. Examples of bases that may be included within the CMP slurry to increase the rate of the ligand exchange reaction with the halogenated ruthenium surface include, but are not limited to, potassium hydroxide (KOH), sodium hydroxide (NaOH), ammonium hydroxide ($NH_4OH$) and tetramethylammonium hydroxide (($CH_3$)$_4$NOH).

In some embodiments, the CMP slurry may be non-aqueous and may include abrasive particles. In one example implementation, the CMP slurry disclosed herein may use EA as a solvent and may further contain a nanoparticle abrasive (such as silicon dioxide ($SiO_2$)), a halogenation reagent (such as TCCA), a ligand (such as an aminopolycarboxylic acid) and a base to catalyze the ligand-assisted reactive dissolution.

Accordingly, the techniques disclosed herein provide a ruthenium CMP process and a ruthenium CMP slurry that primarily use halogenation to create ruthenium-halogen compounds on the ruthenium surface, and use ligand-assisted reactive dissolution for chemical removal of the ruthenium-halogen compounds. Since different ligands react with the halogenated surface at different rates, a variety of different ligands can be used to tune the chemical etch rate achieved during a given CMP process. One advantage of the CMP process and CMP slurry described herein is that chemical and mechanical properties of ruthenium-halogen compounds are more amenable to the CMP process. As such, the CMP process and CMP slurry described herein improve smoothing of the post-etch ruthenium surface, while providing high material removal rates.

As described further herein, the present disclosure provides various embodiments of methods that utilize the new CMP chemistries disclosed herein for planarizing a ruthenium surface. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

According to one embodiment, a method is provided herein for removing ruthenium. The method may generally begin by positioning a substrate in a chemical-mechanical polishing (CMP) system, wherein the CMP system includes a polishing pad mounted on a rotatable platen such that the polishing pad can be rotated and moved across a surface of the substrate, and wherein the substrate includes a ruthenium surface. Next, the method may include dispensing a slurry over the polishing pad. The slurry may generally include a solvent, a halogenation agent that halogenates the ruthenium surface to form a halogenated ruthenium surface, a ligand that reacts with the halogenated ruthenium surface to dissolve the halogenated ruthenium surface, and a catalyst that increases a rate of a ligand exchange reaction with the halogenated ruthenium surface. Next, the method may include polishing the ruthenium surface using the slurry until a predetermined amount of ruthenium has been removed.

In some embodiments, the method may further include controlling relative amounts of the halogenation agent and the ligand in the slurry, such that a rate of halogenation of the ruthenium surface is greater than a rate of dissolution of the halogenated ruthenium surface.

In some embodiments, said dispensing a slurry over the polishing pad may comprise dispensing a slurry that does not include an oxide-forming oxidizing agent. In other embodiments, said dispensing a slurry over the polishing pad may comprise dispensing a slurry that includes the halogenating agent and an oxide-forming oxidizing agent.

In some embodiments, the halogenation agent may include a chlorination agent, which reacts with the ruthenium surface to form a chlorinated ruthenium surface. In such embodiments, the ligand may react with the chlorinated ruthenium surface to dissolve the chlorinated ruthenium surface. In some embodiments, the catalyst that increases the rate of the ligand exchange reaction with the chlorinated ruthenium surface may be a base.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
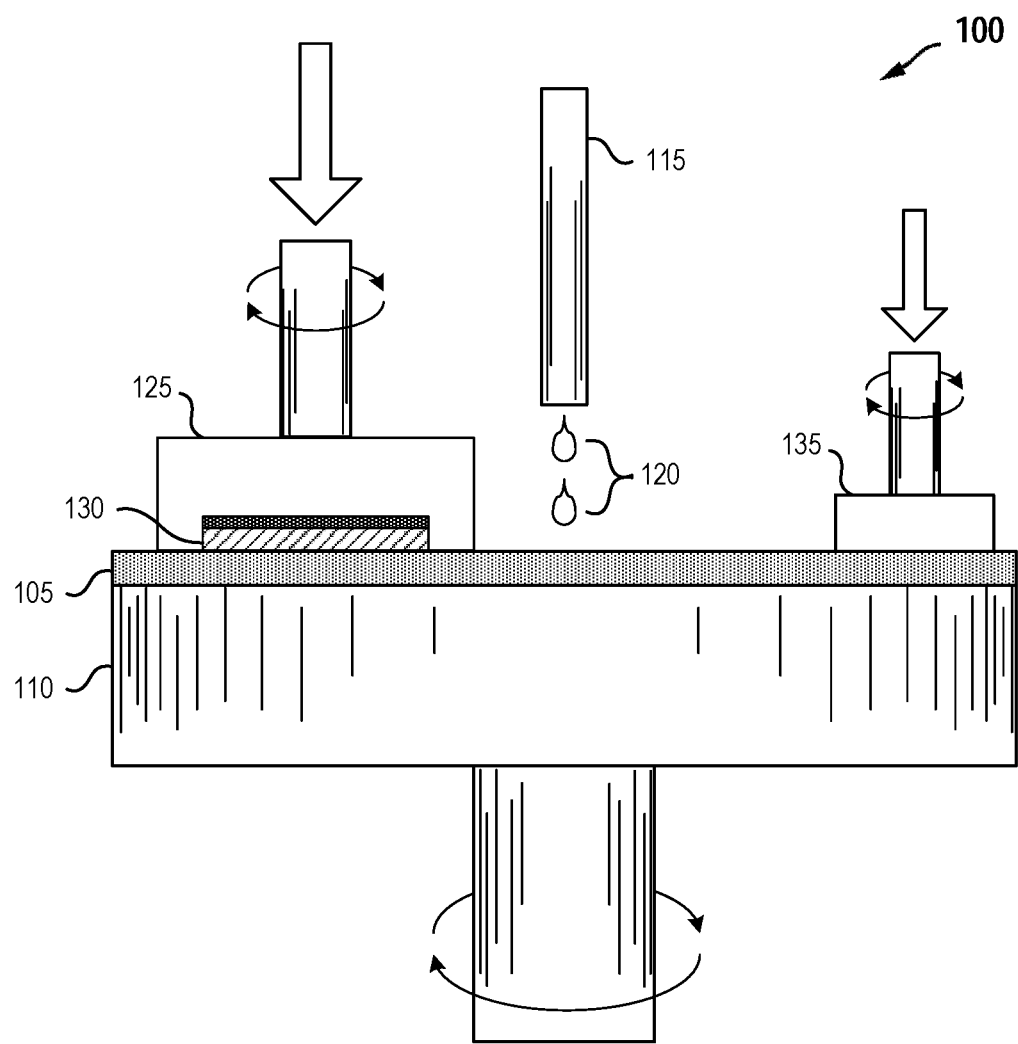
FIG. 1 is a block diagram of a chemical mechanical polishing (CMP) system.

Etching ruthenium with a liquid (wet) chemistry conventionally uses strong oxidizers to create soluble ruthenium species. Currently available Ru etchants use ceric ammonium nitrate, periodic acid, and hypochlorite ions to oxidize metallic $Ru^0$ to $Ru^{8+}$ as $RuO_4$ or related hydrated species. These oxidations, however, leave a rough post-etch surface because of the increased reactivity of ruthenium at grain boundaries. Another disadvantage of conventional ruthenium wet etch processes is that the reaction products are highly soluble. This solubility leads to oxidation-limited etching, which only exacerbates roughness formation during etching. These disadvantages are amplified when these same oxidizers are used as part of Ru CMP slurries. As such, new etch chemistries for use in Ru CMP are needed for better ruthenium removal.

The present disclosure provides new CMP slurry chemistries for planarizing a ruthenium (Ru) surface. As described in more detail below, the Ru CMP slurry described herein includes a halogenating agent to chemically modify the ruthenium surface and form a ruthenium halide or oxyhalide passivation layer on the ruthenium surface, a ligand (or ligands) for reactive dissolution of the ruthenium halide or oxyhalide passivation layer, a strong base or other catalyst to increase the rate of the ligand reaction, and abrasive grinding media in a non-aqueous solvent. Surfactants or other stabilizers can also be used to help keep all of these components dissolved or suspended in the CMP slurry.

Unlike conventional CMP slurry chemistries used for planarizing ruthenium, the CMP slurry chemistry disclosed herein focuses on oxidizing $Ru^0$ to $Ru^{3+}$ rather than the higher oxidation states achieved with conventional Ru CMP slurries. Using a lower oxidation state has the advantage of providing options for creating both soluble and insoluble ruthenium products. The CMP slurry chemistries disclosed herein achieve lower oxidation states by primarily using halogenation, rather than oxidization, of the ruthenium surface to form a ruthenium halide or oxyhalide passivation layer. Direct halogenation of metallic $Ru^0$ leads to the formation of $Ru^{3+}X_3$ (where X is a halogen). In some embodiments, halogenation may be achieved by exposing the ruthenium surface to a CMP slurry comprising a chlorination agent, a fluorinating agent or a brominating agent.

Chlorination of the ruthenium surface can be accomplished using a wide variety of chlorination reagents, such as trichloroisocyanuric acid (TCCA), oxalyl chloride, thionyl chloride, and N-chlorosuccinimide. Exposing the ruthenium surface to these chlorination agents chemically modifies the ruthenium surface to form a ruthenium chloride passivation layer, such as but not limited to ruthenium trichloride ($RuCl_3$). It is noted that this is not an exhaustive list of all possible chlorination agents that may be used to form a ruthenium chloride passivation layer. It is further noted that the ruthenium surface may be exposed to other halogenation agents to form other ruthenium halide or oxyhalide passivation layers. For example, fluorination or bromination of the ruthenium surface can be accomplished using fluorinating or brominating agents, such as 1-Fluoro-2,4,6-trimethylpyridinium tetrafluoroborate, N-fluorobenzenesulfonimide, N-bromosuccinimide, or dibromoisocyanuric acid. When exposed to these halogenating agents, a ruthenium fluoride or ruthenium bromide passivation layer is formed on the ruthenium surface. Halogenating agents are generally hydrolyzed by water. Thus, regardless of the halogenating agent used, the halogenation must take place in a solvent or solvent blend where hydrolysis does not occur.

In one example embodiment, a CMP slurry in accordance with the present disclosure may include TCCA dissolved in a non-aqueous solvent, such as ethyl acetate (EA), acetone, acetonitrile, or a chlorocarbon. $Ru^0$ reacts quickly to form a self-limiting ruthenium chloride ($RuCl_3$) passivation layer when exposed to TCCA in a non-aqueous solvent, such as ethyl acetate. The self-limiting ruthenium chloride passivation layer may also contain $RuO_xCl_y$ species if oxide-forming oxidizing agents, such as water or dissolved oxygen, are present during the chlorination reaction. "Self-limiting" means that only a limited thickness of the ruthenium surface is modified or removed, regardless of how long a given etch solution is in contact with the ruthenium surface. The self-limiting reaction can be limited by one or more monolayers of reaction or a partial monolayer of reaction. Once created, the ruthenium chloride passivation layer can be solubilized through ligand exchange reactions. The addition of reactive ligands to the non-aqueous TCCA solution transforms the CMP slurry chemistry described herein from a self-limiting surface passivation to a continuous etch process.

A wide variety of ligands may be used in the CMP slurry to chemically remove the ruthenium chloride passivation layer through ligand-assisted reactive dissolution. For example, ligands such as acetyl acetone (ACAC) or aminopolycarboxylic acids work well for ligand-assisted dissolution of insoluble $RuCl_3$. Ethylenediaminetetracetic acid (EDTA) is an example aminopolycarboxylic acid that reacts with $RuCl_3$ to form a ruthenium aminopolycarboxylate. Alternative ligands for reactive dissolution of insoluble $RuCl_3$ include, but are not limited to, iminodiacetic acid (IDA) and diethylenetriaminepentaacetic acid (DTPA). EDTA, IDA, and DTPA can be used in aqueous solution, while ACAC can be used in aqueous solution, ethanol, dimethyl sulfoxide (DMSO) or other organic solvents. In some embodiments, the ligand or ligands included within the CMP slurry can be used to tune the chemical etch rate achieved during a given CMP process. For example, different ligands react with the ruthenium chloride passivation layer (or other halogenated ruthenium surface layer) at different rates. Because the kinetics of the reaction is highly dependent on the reactivity of the ligand used, different ligands may be selected and used to tune the chemical etch rate achieved during a given CMP process.

The ligand exchange reaction (e.g., substituting EDTA for Cl ligands) is base catalyzed. Therefore, a base is needed in the CMP slurry to deprotonate EDTA (or ACAC) to form the reactive anionic form of the ligand. A wide variety of bases, such as potassium hydroxide (KOH), sodium hydroxide (NaOH), ammonium hydroxide ($NH_4OH$), tetramethylammonium hydroxide (($CH_3$)$_4$NOH), and other strong bases can be used in the CMP slurry to deprotonate the ligand. Non-aqueous bases (such as quaternary ammonium hydroxides, trialkylamines) or basic solvents (such as amino alcohols) can also be used.

Thus, in one embodiment, the CMP slurry described herein may contain TCCA to facilitate a chlorination reaction with the ruthenium surface and form a ruthenium chloride (e.g., $RuCl_3$) passivation layer on the ruthenium surface, a ligand such as ACAC or EDTA for ligand-assisted reactive dissolution of the ruthenium chloride passivation layer, and a base or other catalyst to increase the rate of the ligand reaction and continuously etch the ruthenium surface. The relative kinetic rates of the chlorination reaction and the ligand-assisted dissolution reaction can be adjusted by changing the concentrations of TCCA and the ligand in the slurry solution.

As noted above, conventional ruthenium wet etch chemistries and CMP slurries rely on oxidation-limited etching, which increases surface roughness during etching and planarization. In contrast, the techniques described herein improve post-etch surface morphology by ensuring that the overall etch reaction is dissolution-limited (i.e. by ensuring the halogenation rate is much faster than the ligand-assisted dissolution rate). This can be achieved with the techniques described herein because the halogenation kinetics and dissolution kinetics can be independently controlled by adjusting the relative amounts of the halogenation agent and the ligand included within the CMP slurry, so that the rate of halogenation of the ruthenium surface is greater than the rate of dissolution of the halogenated ruthenium surface. Currently available oxidizer-based etch chemistry lacks this independent control.

In some embodiments, the CMP slurry described herein includes halogenating agents, but is free from oxide-forming oxidizing agents, such as water or dissolved oxygen. In other embodiments, the CMP slurry may contain both halogenating agents and oxide-forming oxidizing agents. In one example embodiment, the CMP slurry described above may further include a predetermined amount of water or dissolved oxygen. When chlorination is performed in the presence of oxide-forming oxidizing agents, such as water or dissolved oxygen, a ruthenium chloride (e.g., $RuCl_3$) passivation layer containing $RuO_xCl_y$ species is created on the ruthenium surface. Since the $RuO_xCl_y$ species are generally more soluble than the ruthenium chloride passivation layer, the presence of the $RuO_xCl_y$ species on the ruthenium surface increases the material removal rate achieved in the CMP process.

In addition to the liquid components mentioned above, the CMP slurry described herein may also contain abrasive media, such as silica, alumina, ceria, or other nanoparticles to mechanically grind the ruthenium surface. This mechanical grinding raises the local temperature at high points on the wafer surface. This local heating serves to increase the etch kinetics, which helps to planarize the wafer. Since the ligand exchange reactions used to solubilize $RuCl_3$ are very temperature sensitive, the local heating created at the high points is very effective at increasing the local etch rate in those areas.

In addition to a new CMP slurry, the present disclosure provides an improved CMP process, which utilizes the CMP slurry chemistries disclosed herein to planarize a ruthenium surface. The CMP process disclosed herein can be used on a wide variety of CMP tools and systems. FIG. 1 illustrates one example of a CMP system 100 that includes a polishing pad 105 mounted on top of a rotating platen 110 and a slurry dispenser 115 for dispensing a slurry 120 over the top of the polishing pad 105. As the platen 110 rotates, the motion of the platen 110 distributes the slurry 120 over the surface of the polishing pad 105. A wafer carrier 125 holds and positions a wafer 130 (e.g., a semiconductor substrate), and applies downward force between the wafer surface and the polishing pad 105. The wafer carrier 125 can rotate and move radially along the platen 110. A pad conditioner 135 is used to maintain pad flatness and surface quality. The techniques described herein include an improved slurry chemistry as part of the chemical, reactive portion of chemical-mechanical material removal. As mentioned, FIG. 1 illustrates one example CMP system. It will be recognized by those skilled in the art that the techniques, methods, processes and slurry chemistries described herein may be used with a wide variety of CMP tools and systems and are not limited to that shown in FIG. 1.

Figure 2:
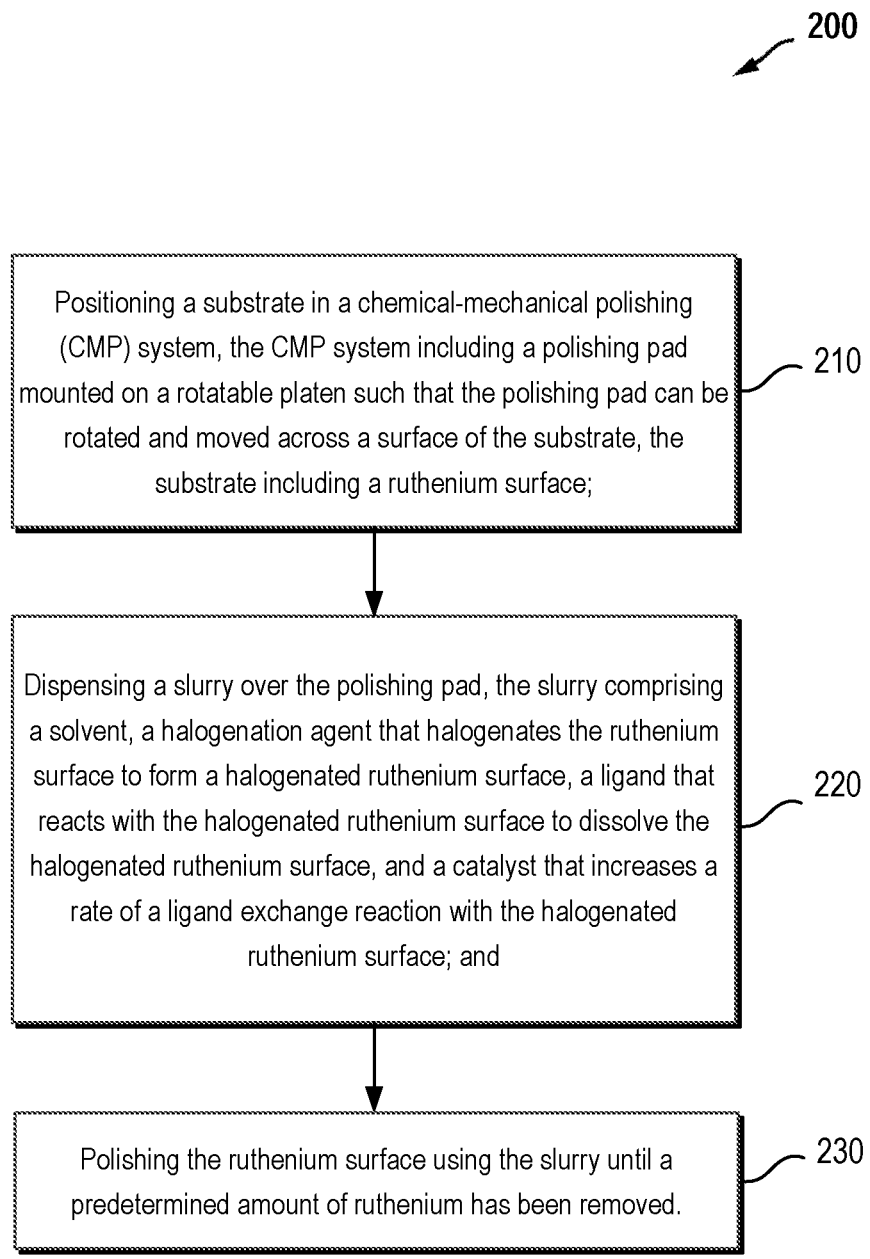
FIG. 2 is a flowchart diagram illustrating one embodiment of a method utilizing the techniques described herein.

Finally, the present disclosure provides a variety of methods that utilize the new CMP slurry chemistries and CMP processes disclosed herein. FIG. 2 illustrates one embodiment of a method that utilizes the techniques described herein for planarizing or removing ruthenium from a surface of a substrate. It will be recognized that the embodiment of FIG. 2 is merely exemplary and additional methods may utilize the techniques described herein. Further, additional processing steps may be added to the method shown in the FIG. 2 as the steps described are not intended to be exclusive. Moreover, the order of the steps is not limited to the order shown in the figures as different orders may occur and/or various steps may be performed in combination or at the same time.

FIG. 2 illustrates one embodiment of a method 200 of removing ruthenium. The method 200 may generally begin by positioning a substrate in a chemical-mechanical polishing (CMP) system (in step 210). FIG. 1 illustrates one embodiment of a CMP system (or CMP tool) in which the substrate may be positioned in step 210. As noted above and shown in FIG. 1, the CMP system 100 may generally include a polishing pad 105 mounted on a rotatable platen 110, such that the polishing pad 105 can be rotated and moved across a surface of the substrate. In some embodiments, the substrate may include a ruthenium surface.

Next, the method 200 may include dispensing a slurry over the polishing pad (in step 220). As noted above, the slurry may generally include a solvent, a halogenation agent that halogenates the ruthenium surface to form a halogenated ruthenium surface, a ligand that reacts with the halogenated ruthenium surface to dissolve the halogenated ruthenium surface, and a catalyst that increases a rate of a ligand exchange reaction with the halogenated ruthenium surface. In some embodiments, the method 200 may include controlling relative amounts of the halogenation agent and the ligand included within the slurry, such that a rate of halogenation of the ruthenium surface is greater than a rate of dissolution of the halogenated ruthenium surface.

Next, method 200 may include polishing the ruthenium surface using the slurry until a predetermined amount of ruthenium has been removed (in step 230).

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for planarizing a surface of a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the ruthenium CMP techniques are described herein with reference to specific embodiments, various modifications and changes can be made without departing from the scope of the present disclosure. Accordingly, the specification and figures are to be regarded in an illustrative rather than a restrictive sense, and such modifications are intended to be included within the scope of the present disclosure. Further, any benefits, advantages, or solutions to problems that are described herein with regard to specific embodiments are not intended to be construed as a critical, required, or essential feature or element of any or all the claims.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of removing ruthenium, the method comprising:
    positioning a substrate in a chemical-mechanical polishing (CMP) system, the CMP system including a polishing pad mounted on a rotatable platen such that the polishing pad can be rotated and moved across a surface of the substrate, the substrate including a ruthenium surface;
    dispensing a slurry over the polishing pad, the slurry comprising a non-aqueous solvent, a halogenation agent that halogenates the ruthenium surface to form a halogenated ruthenium surface that is insoluble in the non-aqueous solvent, a ligand that reacts with the halogenated ruthenium surface to dissolve the halogenated ruthenium surface, and a catalyst that increases a rate of a ligand exchange reaction with the halogenated ruthenium surface, wherein the slurry does not include an oxide-forming agent; and polishing the ruthenium surface using the slurry until a predetermined amount of ruthenium has been removed.

2. The method of claim 1, further comprising controlling relative amounts of the halogenation agent and the ligand in the slurry, such that a rate of halogenation of the ruthenium surface is greater than a rate of dissolution of the halogenated ruthenium surface.

3. The method of claim 2, wherein the halogenation agent comprises a chlorination agent, which reacts with the ruthenium surface to form a chlorinated ruthenium surface, and wherein the ligand that reacts with the chlorinated ruthenium surface to dissolve the chlorinated ruthenium surface.

4. The method of claim 1, wherein the halogenation agent comprises a chlorination agent, which reacts with the ruthenium surface to form a chlorinated ruthenium surface, and wherein the ligand that reacts with the chlorinated ruthenium surface to dissolve the chlorinated ruthenium surface.

5. The method of claim 1, wherein the catalyst is a base.

6. The method of claim 5, wherein the base comprises potassium hydroxide (KOH), sodium hydroxide (NaOH), ammonium hydroxide ($NH_4OH$) or tetramethylammonium hydroxide (($CH_3$)$_4$NOH).

7. The method of claim 1, wherein the slurry is non-aqueous, and wherein the non-aqueous slurry prevents hydrolysis of the halogenation agent.

8. The method of claim 1, wherein the slurry includes abrasive particles.

9. The method of claim 1, wherein the slurry limits an oxidation state of the ruthenium surface to $Ru^{3+}$ by including the halogenation agent and not including the oxide-forming oxidizing agent within the slurry.

10. The method of claim 1, wherein the slurry does not include water, dissolved oxygen or another oxide-forming oxidizing agent.

11. The method of claim 1, wherein the halogenation agent reacts with the ruthenium surface to form a self-limiting ruthenium trichloride ($RuCl_3$) passivation layer.

12. The method of claim 1, wherein the halogenation agent includes trichloroisocyanuric acid (TCCA), oxalyl chloride, thionyl chloride or N-chlorosuccinimide.

13. The method of claim 1, wherein the non-aqueous solvent is ethyl acetate, acetone, acetonitrile, or a chlorocarbon.

14. The method of claim 1, wherein the halogenation agent is a fluorinating agent, wherein the fluorinating agent reacts with the ruthenium surface to form a fluorinated ruthenium surface, and wherein the ligand is reactive with the fluorinated ruthenium surface.

15. The method of claim 1, wherein the halogenation agent is a brominating agent, wherein the brominating agent reacts with the ruthenium surface to form a brominated ruthenium surface, and wherein the ligand is reactive with the brominated ruthenium surface.

16. The method of claim 1, wherein the ligand comprises ethylenediaminetetraacetic acid (EDTA), acetylacetone (ACAC), iminodiacetic acid (IDA) or diethylenetriaminepentaacetic acid (DTPA).

17. The method of claim 1, wherein the ligand reacts with the halogenated ruthenium surface to solubilize the halogenated ruthenium surface through the ligand exchange reaction and provide ligand-assisted reactive dissolution of the halogenated ruthenium surface.

18. The method of claim 17, further comprising controlling relative amounts of the halogenation agent and the ligand in the slurry, such that a rate of halogenation of the ruthenium surface is greater than a rate of dissolution of the halogenated ruthenium surface.

19. The method of claim 18, wherein the halogenation agent comprises a chlorination agent, which reacts with the ruthenium surface to form a chlorinated ruthenium surface, and wherein the ligand that reacts with the chlorinated ruthenium surface to dissolve the chlorinated ruthenium surface.

20. The method of claim 1, wherein the halogenation agent in the non-aqueous solvent reacts with the ruthenium surface to form a self-limiting halogenated ruthenium passivation layer, and wherein the ligand transforms the method of removing ruthenium from a self-limiting surface passivation to a continuous etch process.

* * * * *